United States Patent
Brown et al.

(10) Patent No.: US 7,812,680 B1
(45) Date of Patent: Oct. 12, 2010

(54) MEMS RESONATOR-BASED SIGNAL MODULATION

(75) Inventors: Andrew R. Brown, Northville, MI (US); Wan-Thai Hsu, Ann Arbor, MI (US); Kenneth R. Cioffi, San Jose, CA (US); Didier Lacroix, Los Gatos, CA (US)

(73) Assignee: Discera, Inc., San Jose, CA (US)

( * ) Notice: Subject to any disclaimer, the term of this patent is extended or adjusted under 35 U.S.C. 154(b) by 176 days.

(21) Appl. No.: 11/417,833

(22) Filed: May 3, 2006

Related U.S. Application Data (60) Provisional application No. 60/677,288, filed on May 3, 2005, provisional application No. 60/677,289, filed on May 3, 2005.

(51) Int. Cl.
*H03B 5/36* (2006.01)

(52) U.S. Cl. .................. 331/154; 331/116 M; 333/186; 333/197

(58) Field of Classification Search .................. 331/154, 331/156, 116 M; 333/186, 197
See application file for complete search history.

(56) References Cited

U.S. PATENT DOCUMENTS

| | | | |
|---|---|---|---|
| 4,454,483 A | 6/1984 | Baylor | |
| 4,712,078 A | 12/1987 | Slobodnik, Jr. et al. | 331/99 |
| 6,236,281 B1 * | 5/2001 | Nguyen et al. | 331/154 |
| 6,249,155 B1 | 6/2001 | Hartman et al. | 327/106 |
| 6,424,074 B2 * | 7/2002 | Nguyen | 310/309 |
| 6,930,569 B2 | 8/2005 | Hsu | 333/186 |
| 6,995,622 B2 | 2/2006 | Partridge et al. | 331/66 |
| 7,215,214 B1 * | 5/2007 | Taheri et al. | 331/107 A |
| 2006/0166639 A1 * | 7/2006 | Kaiser et al. | 455/339 |

OTHER PUBLICATIONS

Skyworks Solutions, Inc., "Application Note: Fine Frequency Control Using the SKY72300, SKY72301, and SKY72303 Dual Synthesizers/PLLs," pp. 1-6 (Sep. 2005).

Wang et al., "VHF Free-Free Beam High-Q Micromechanical Resonators," *Technical Digest*, 12th Int'l IEEE Micro Electro Mechanical Systems Conf., pp. 453-458 (1999).

* cited by examiner

*Primary Examiner*—Robert Pascal
*Assistant Examiner*—James E Goodley
(74) *Attorney, Agent, or Firm*—Lempia Braidwood LLC (57) ABSTRACT

Disclosed herein are devices and methods for generating a modulated signal with a MEMS resonator, or microresonator. A bias, or polarization, voltage for activating the MEMS resonator is determined by a control signal, or input voltage, indicative of information to be carried by the modulated signal. In some cases, the MEMS resonator may be driven by an oscillator circuit to facilitate operation of the MEMS resonator. The control signal may include an amplitude modulated voltage or a digital data stream such that output signals of the MEMS resonator or oscillator circuit may carry information via frequency modulation, such as frequency shift keying modulation.

21 Claims, 5 Drawing Sheets

MEMS RESONATOR-BASED SIGNAL MODULATION

CROSS-REFERENCES TO RELATED APPLICATIONS

This application claims the benefit of U.S. provisional applications entitled "Method and Apparatus for Providing a Modulated Signal" and "Frequency and Temperature Compensated MEMS Resonator," which were filed May 3, 2005, and assigned Ser. Nos. 60/677,289, and 60/677,288, respectively. The entire disclosures of the aforementioned provisional applications are hereby expressly incorporated by reference.

This application relates to commonly assigned and concurrently filed U.S. non-provisional application entitled "Frequency and Temperature Compensation Synthesis for a MEMS Resonator" Ser. No. 11/147,739, the entire disclosure of which is hereby expressly incorporated by reference.

STATEMENT REGARDING FEDERALLY SPONSORED RESEARCH OR DEVELOPMENT

This invention was made with government support under Contract No.: 70NANB4H3001 awarded by the National Institute for Standards and Technology (NIST). The government has certain rights in the invention.

BACKGROUND OF THE DISCLOSURE

1. Field of the Disclosure

The disclosure relates generally to communications and, more particularly, to communications using MEMS (microelectromechanical systems) resonators, or microresonators.

2. Brief Description of Related Technology

Modulation of a communications signal can be accomplished using many techniques, such as amplitude modulation (AM), frequency modulation (FM), pulse-width modulation, and frequency-shift-keying. For many years, broadcast radio has been based on AM and FM modulation schemes. More recently, wireless communications, such as cellular telephony, have given rise to use of other modulation techniques.

The 433 MHz communications band is a general purpose, low-power, wireless communication band. Applications in this band include automotive remote keyless entry, wireless tire pressure monitoring, remote control applications, wireless fire alarm systems, garage door openers, remote gate entry, remote window shutters, RFID, and numerous other short range, low power, wireless control and communication applications.

Two conventional communication techniques for wireless data transfer are Amplitude-Shift-Keying (ASK) modulation and Frequency-Shift-Keying (FSK) modulation. FSK modulation provides improved noise and interference immunity relative to ASK, and is the modulation technique of choice for many applications. For example, FSK modulation is used in both Europe and Japan in tire pressure monitoring applications. ASK modulation presently dominates tire pressure monitoring in the USA, although FSK modulation has been increasingly used due to better performance in interference and polarization robustness.

Figure 1:
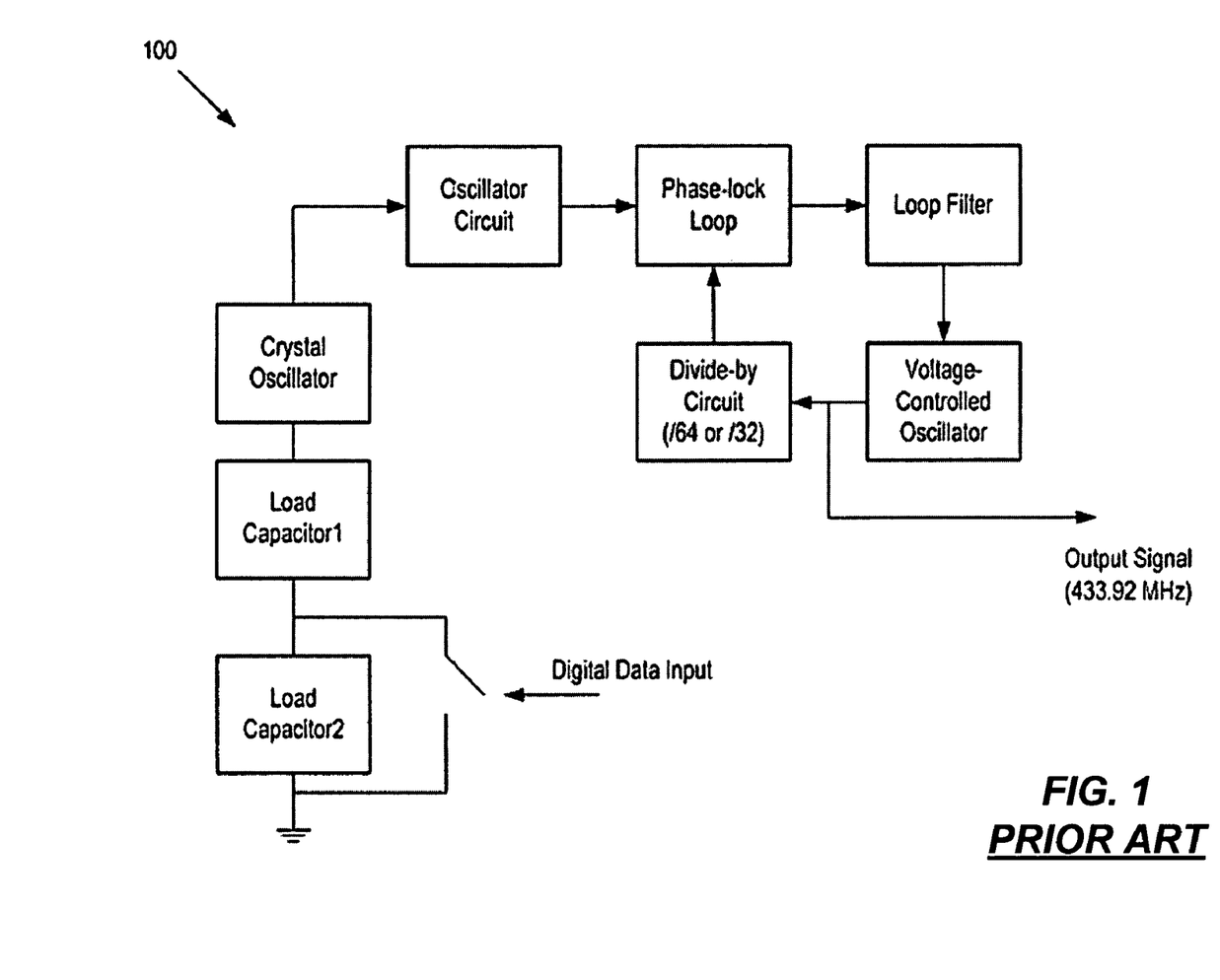
FIG. 1 is a block diagram of a conventional FSK transmitter based on a quartz crystal oscillator.

FIG. 1 depicts a conventional FSK transmitter circuit. In many cases, FSK modulation is implemented with a transmitter having a quartz crystal oscillator resonating at 6.78 MHz or 13.56 MHz, an oscillator circuit, a voltage-controlled oscillator (VCO) operating at 433.92 MHz, and a phase-lock loop (PLL) with either a divide-by-32 or divide-by-64 circuit depending on the quartz crystal used.

The frequency at which the quartz crystal oscillates is affected by a change in the oscillator's capacitive load. As depicted in FIG. 1, FSK modulation of the output signal is produced by switching one of two load capacitors in and out of the circuit in response to a digital data signal input. Due to the high-Q nature of the quartz crystal oscillator, however, the change in frequency (i.e., frequency pulling) that can be induced is limited. As a result, the achievable frequency pulling is typically in the range of 50-80 ppm. The frequency deviation is thus quite small, thereby limiting the amount, or depth, of modulation present in the output signal.

The sensitivity requirement for a device receiving the output signal is a function of the modulation depth achieved in the FSK link. In this way, low modulation depth FSK links lead to higher system costs.

Further costs arise from the need for temperature compensation. Without compensation, crystal oscillators would have a limited operating temperature range, as crystal temperature coefficients generally rise dramatically as temperature exceeds 85° C. Crystal oscillators are thus typically temperature-compensated, leading to increased system cost. Integrated circuits for temperature compensation of crystal oscillators are commercially available from vendors such as Infineon, Molexis, etc.

Transmitters implementing FSK modulation have also used a surface-acoustic-wave (SAW) resonator that resonates at directly 433 MHz. The frequency of the SAW-stabilized oscillator is pulled, in similar fashion as described for the crystal oscillator, using either a varactor or switched capacitors.

Unfortunately, SAW resonators exhibit frequency inaccuracy as well as a large temperature coefficient. These inaccuracies in the output frequency range lead to stricter requirements for the receiver, such as a larger intermediate frequency (IF) bandwidth. The need for a larger IF bandwidth negatively impacts receiver sensitivity, and ultimately limits the link margin for a given transmitted power.

SUMMARY OF THE DISCLOSURE

In accordance with one aspect of the disclosure, a signal generator includes a MEMS resonator configured for activation by a bias voltage and development of a resonator signal having a resonant frequency determined by the bias voltage. The signal generator further includes an oscillator circuit coupled to the MEMS resonator to facilitate oscillation of the resonator signal and generation of an output signal based on the resonator signal, and a port coupled to the MEMS resonator to receive a control signal from which the bias voltage is determined such that the output signal is modulated by the control signal.

In some cases, the control signal includes an amplitude-modulated signal reflective of information to be transmitted via frequency modulation of the output signal. Alternatively or additionally, the control signal includes a digital data stream reflective of information to be transmitted via frequency shift keying modulation of the output signal. In other cases, the digital data stream may include a pseudorandom generated bit sequence.

The signal generator may further include a plurality of MEMS resonators having the first-named MEMS resonator and a switch coupling the plurality of MEMS resonators and the port to selectively provide the bias voltage in accordance with the control signal.

Alternatively or additionally, the signal generator may further include a temperature sensor to provide an indication of an operating temperature for the MEMS resonator, and a fractional-N synthesizer responsive to the operating temperature indication for frequency adjustment of the output signal from the oscillator circuit. The signal generator may then further include a voltage source coupled to the port to generate the control signal in response to information sensed by the voltage source.

In accordance with another aspect of the disclosure, a method is useful for generation of a communication signal for transmission of information carried by a control signal. The method includes the steps of receiving the control signal, activating a MEMS resonator via a bias voltage, determining the bias voltage in accordance with the control signal, and driving the MEMS resonator for the generation of the communication signal and the transmission of the information carried by the control signal.

In some cases, the determining step includes providing the control signal to a switch to direct the control signal to a plurality of MEMS resonators for selected activation thereof in accordance with the information.

The method may further include the step of generating the control signal with a voltage source responsive to the information.

In accordance with yet another aspect of the disclosure, a device to generate a modulated signal carrying information includes a data input to provide an input voltage indicative of the information, a MEMS resonator having an output frequency based on a bias voltage determined by the input voltage, an oscillator circuit coupled to the MEMS resonator to develop an oscillator signal based on the output frequency of the MEMS resonator, and a frequency multiplier coupled to the oscillator circuit to generate the modulated signal in accordance with the oscillator signal and the output frequency of the MEMS resonator.

BRIEF DESCRIPTION OF THE DRAWING FIGURES

For a more complete understanding of the disclosure, reference should be made to the following detailed description and accompanying drawing figures, in which like reference numerals identify like elements in the figures, and in which.

While the disclosed device and method are susceptible of embodiments in various forms, there are illustrated in the drawing (and will hereafter be described) specific embodiments of the invention, with the understanding that the disclosure is intended to be illustrative, and is not intended to limit the invention to the specific embodiments described and illustrated herein.

DETAILED DESCRIPTION OF PREFERRED EMBODIMENTS

The invention generally relates to signal modulation based on the capacitance exhibited by MEMS resonators. For this and other reasons, the disclosed invention is well suited for use with a variety of electrostatic MEMS resonators having a terminal to which a bias or polarization voltage is applied to activate or otherwise prepare the resonator for operation. Suitable resonators may, but need not, have a terminal dedicated to application of the bias voltage in addition to the other terminals used for resonator excitation (i.e., driving and sensing).

While a primary function of the bias or polarization voltage in these devices is to create a force that allows the device to resonate, the methods and devices disclosed herein take advantage of the bias voltage to control the resonant frequency of the device. The voltage vs. frequency dependence for a typical MEMS resonator can range from 0.1 ppm/mV to 1 ppm/mV, thereby providing a wide range of frequency modulation.

As described below, the modulation can be analog FM in nature or it can be digital (FSK).

Figure 2:
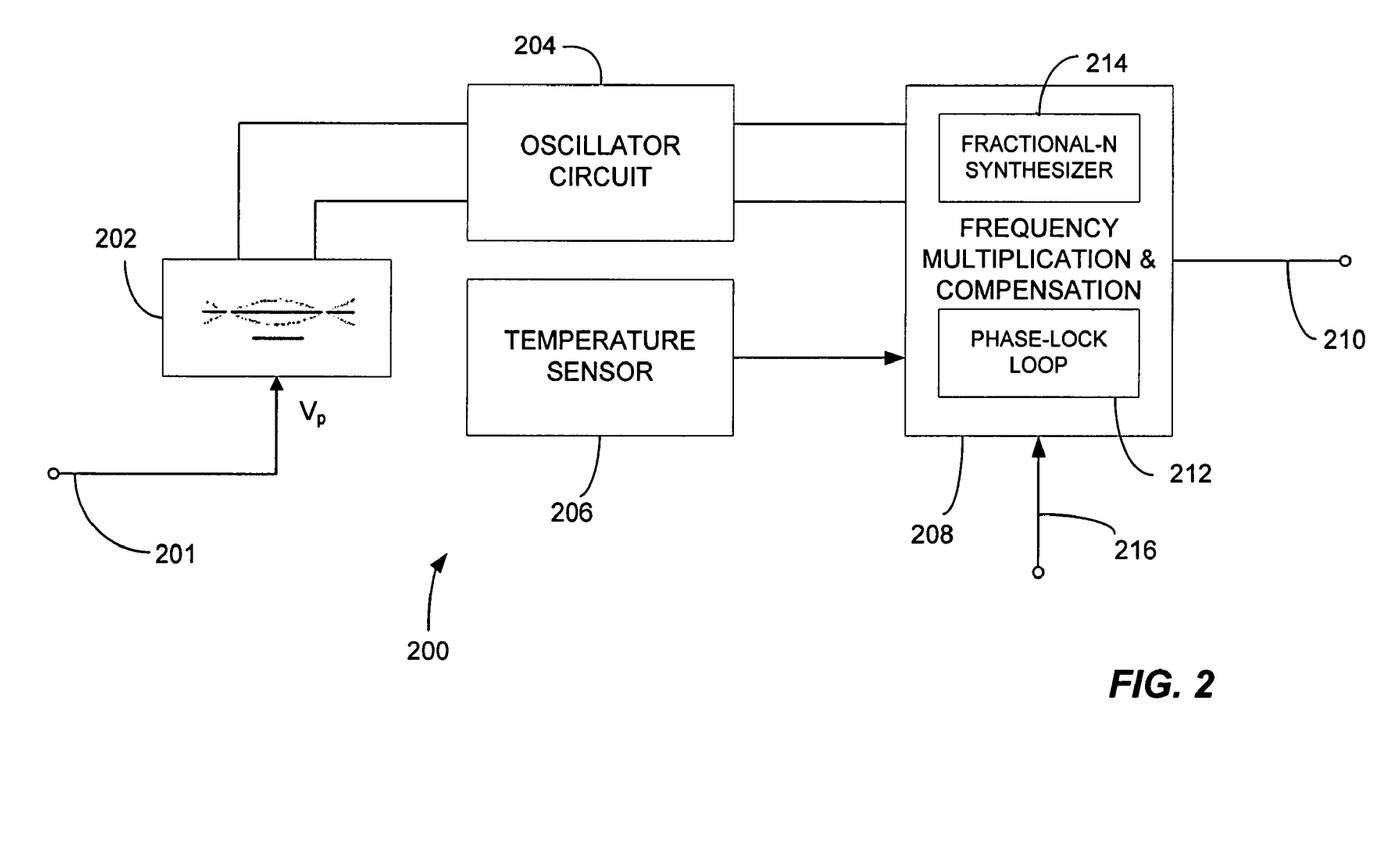
FIG. 2 is a block diagram of a signal generation device in accordance with one aspect of the disclosure.

With reference to the exemplary embodiment shown in FIG. 2, an FM or FSK signal is generated or produced by a MEMS-based modulation device indicated generally at 200. The modulation device 200 is responsive to analog information or digital data provided via an input port 201. The modulation device 200 may be part of a communication or signal transmission device or system, such as an FSK transmitter, for communication of the information or data in accordance with one aspect of the disclosure. The modulation device 200 includes a MEMS resonator 202, which is driven and implemented with an oscillator circuit 204. The modulation device 200 (or, more generally, the communication system) generates an output signal having a desired frequency obtained from the output of the oscillator circuit 204, which may then be conditioned or adjusted to counteract the effects of temperature and other factors. To that end, the modulation device 200 includes a temperature sensor 206 and frequency compensation and multiplication circuitry 208.

The MEMS resonator 202 may be of any design or configuration in which a bias or polarization voltage is determinative of the resonant frequency. For example, the MEMS resonator 202 may be a three-terminal design having a clamped-clamped beam or free-free beam. For further information regarding these exemplary resonator designs, please see U.S. Pat. Nos. 6,249,073 and 6,930,569, the disclosures of which are hereby incorporated by reference. More generally, practice of the disclosed methods and devices is not limited to any particular resonant structure (e.g., beam, interdigitated comb, disc, etc.), resonant mode (lateral, vertical, flexural, etc.), or other characteristic of the resonator. Each of these designs is activated via the bias voltage for resonance at a frequency determined by, among other factors, the bias voltage.

Generally speaking, the oscillator circuit 204 facilitates the oscillation of the resonator 202 at its resonant frequency. To that end, the oscillator circuit 204 provides drive signals across the drive and sense electrodes of the resonator 202 both during startup and while maintaining resonance. The oscillator circuit 204 may provide signal amplification and other conditioning, and perform other functions well known to those skilled in the art. In some cases, the oscillator circuit 204 may be a standalone unit. More generally, the oscillator circuit 204 may provide very high gain to accommodate the high motional resistance of the resonator 202, while staying within a linear regime to maintain low phase noise, a linear temperature profile, and overall a safe operational range.

The temperature sensor 206 provides an indication of the operating temperature of the MEMS resonator 202. In this way, any variance in resonator frequency due to operating temperature can be addressed via the compensation circuitry 208. The temperature sensor may be a commercially available sensor, such as a National Instruments LM73, although generally a variety of other temperature sensors with sufficient resolution and linearity may be used. For example, for performance levels at or near −18 ppm/deg C, and to achieve a digital quantization error of 2 ppm, the temperature sensor has a resolution of better than 0.1 degree.

In some embodiments, the oscillator circuit 204 and the temperature sensor 206 may be provided, along with other circuit components, via a single, integrated circuit, such as application-specific IC, or ASIC, rather than via separate, or discrete, standalone devices.

An output signal of the oscillator circuit 204 is provided to the compensation circuitry 208 to adjust the frequency to a desired frequency. In many cases, the adjustment will involve frequency multiplication from the reference frequency established by the resonance of the MEMS resonator 202 and the oscillator circuit 204. Generally speaking, the compensation circuitry 208 may correct for variances in the reference frequency due to operating temperature (as described above), as well as fabrication process effects, to develop or generate an output signal at an output port 210 having a desired modulation scheme to carry information or data at desired frequencies. To those ends, the compensation circuitry 208 may include components typically utilized in frequency multipliers (or synthesizers), such as a phase-lock loop circuit 212 and a fractional-N synthesizer 214. The components of the compensation circuitry 208 are shown in simplified form for ease in illustration only, and may include a number of additional components directed to supporting the frequency correction and multiplication technique. Further information regarding the operation of the compensation circuitry 208, its use of the temperature indication, and the manner in which the contributions from temperature variance, frequency offset, and frequency selection are combined, may be found in the above-referenced, non-provisional patent application concurrently filed herewith. As a final note, the compensation circuitry 208 may receive a data signal via a port 216, which indicates a desired output frequency for the signal modulation device 200.

Figure 3:
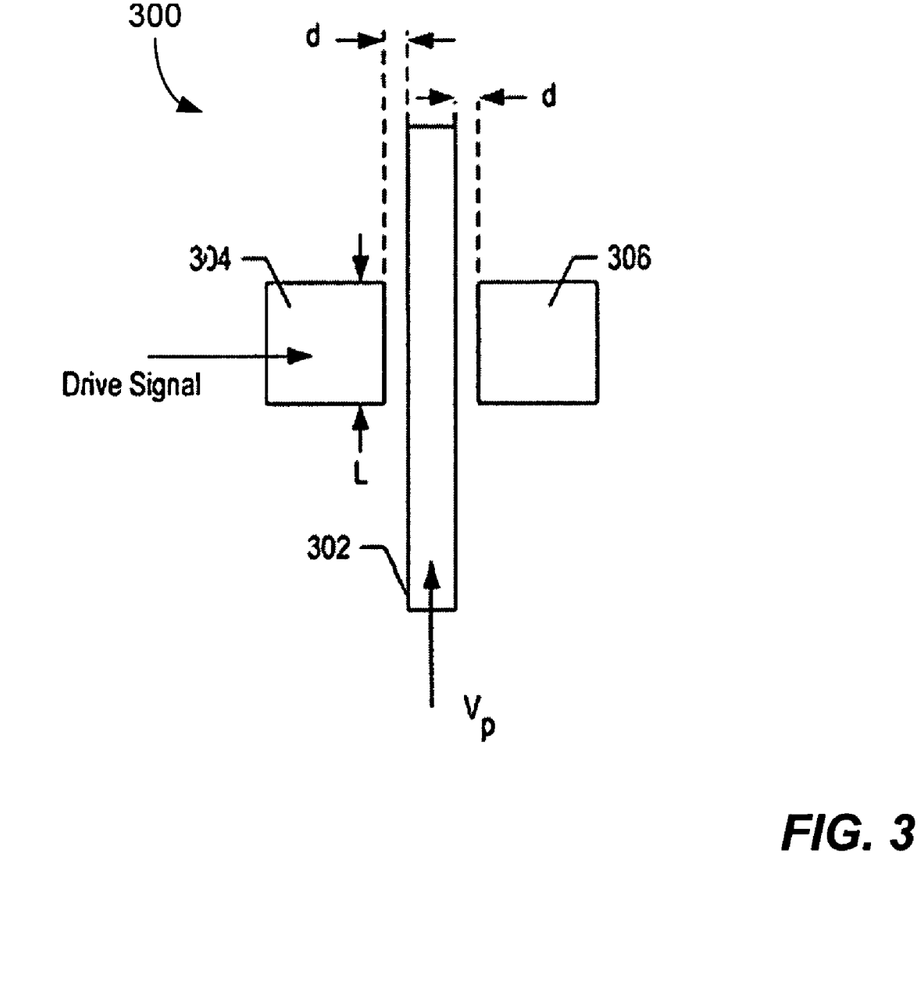
FIG. 3 is a schematic diagram of a MEMS resonator of the signal generation device of FIG. 2 in accordance with an exemplary embodiment.

The frequency output of the oscillator circuit 204 is based on the equivalent electrical resistance of the MEMS resonator 202. The equivalent electrical output resistance of a capacitively-coupled micromechanical resonator is expressed by:

$$R_{io} = \frac{\sqrt{KM} \, d^4}{Q\varepsilon_o^2 L^2 h^2 V_p^2},$$

where K and M are the effective stiffness and mass of the resonator, d is the capacitive gap size, Q is the resonator's quality factor, Vp is the DC polarization voltage, and L and h are the electrodes' length and height, respectively, as depicted in FIG. 3. Therefore, the frequency output of the oscillator circuit 204, and thus the output signal 210, is affected by changes to polarization voltage Vp.

An advantage to the topology depicted in FIG. 2 is that the temperature coefficient of the resonator can be nulled to a much higher degree than in the case of a crystal oscillator. Further, because this is a fixed-frequency product, the fractional synthesizer 214 can be optimized to operate over an extended temperature range as the tuning requirement is significantly relaxed as compared to a crystal oscillator.

The use of a MEMS resonator in place of a quartz crystal oscillator results in a greater amount of modulation, potentially as high as several hundred ppm. In addition, an improvement in the degree to which the temperature coefficient of the MEMS resonator 202 can be nulled by the PLL is derived by the topology shown in FIG. 2.

In some cases, the MEMS resonator is optimized to provide a large frequency deviation vs. Vp. FIG. 3 depicts an exemplary, capacitively-coupled MEMS resonator indicated generally at 300. The MEMS resonator 300 includes a beam 302, an input electrode 304, and an output electrode 306. A drive signal applied to the input electrode 304 excites the beam 302 into resonance. The equivalent electrical output resistance of the beam 302 is a function of beam design, beam material, and applied D.C. polarization voltage Vp, as described above.

By reducing the gap(s), d, between the beam 302 and the drive electrode 304 and the sense electrode 306, it is possible to derive a large sensitivity of resonant frequency to changes in Vp. A MEMS resonator with enhanced frequency sensitivity to Vp is particularly attractive in those applications wherein phase noise and power handling by the resonator are not driving factors.

The elements shown in FIG. 3, as well as other components of the disclosed devices may be fabricated entirely on silicon or other semiconductor platforms. As a result, any number of silicon or semiconductor fabrication processing techniques may be utilized to fabricate the disclosed devices. Furthermore, the disclosed devices may be integrated on the same substrate with other silicon- or semiconductor-based system components (e.g., MEMS devices). Such devices may be useful, in some cases, in generating or developing the data or information to be carried by the control signal and, ultimately, the output from the disclosed device. A number of MEMS devices are suitable for such integration, including pressure sensors.

Figure 4:
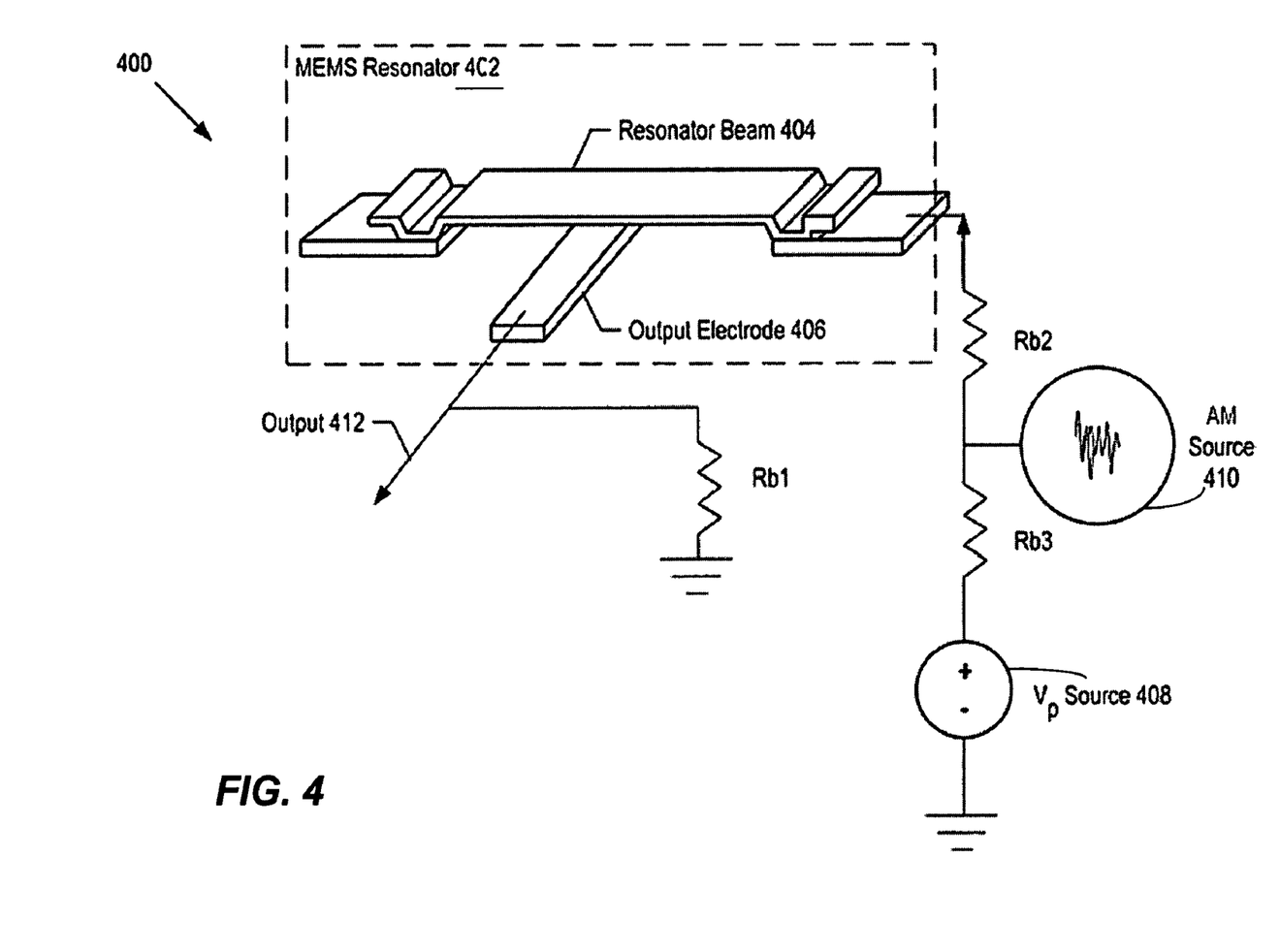
FIG. 4 is a schematic diagram of a MEMS resonator and data source for the signal generation device of FIG. 2 in accordance with another exemplary embodiment; and, FIG. 5 is a block diagram of a signal generation device in accordance with an alternative exemplary embodiment.

With reference now to FIG. 4, an MF modulated signal is produced using a data (or modulation) source with a MEMS modulation device indicated generally at 400. The modulation device 400 includes a MEMS resonator 402, a Vp source 408, a data (or AM) source 410, and resistors Rb1, Rb2, and Rb3. The MEMS resonator 402 has a resonator beam 404 and an output electrode 406. In this case, the bias or polarization voltage applied to the MEMS resonator 402 is derived from the combination of output voltages of the AM source 410 and the Vp source. In short, the AM modulation of the Vp voltage creates an FM modulation at the output 412. In this way, any data or information provided by the data source 410 is reflected via FM modulation of the output signal.

In alternative embodiments, the data source 410 provides a digital data stream to support FSK modulation of the output signal. In this embodiment, the AM voltage source may be a bit stream encoded with ones and zeros alternating between two digital voltages, e.g., 0 and 3V. The output is then an FSK (Frequency Shift Keyed) digital communications signal.

Figure 5:
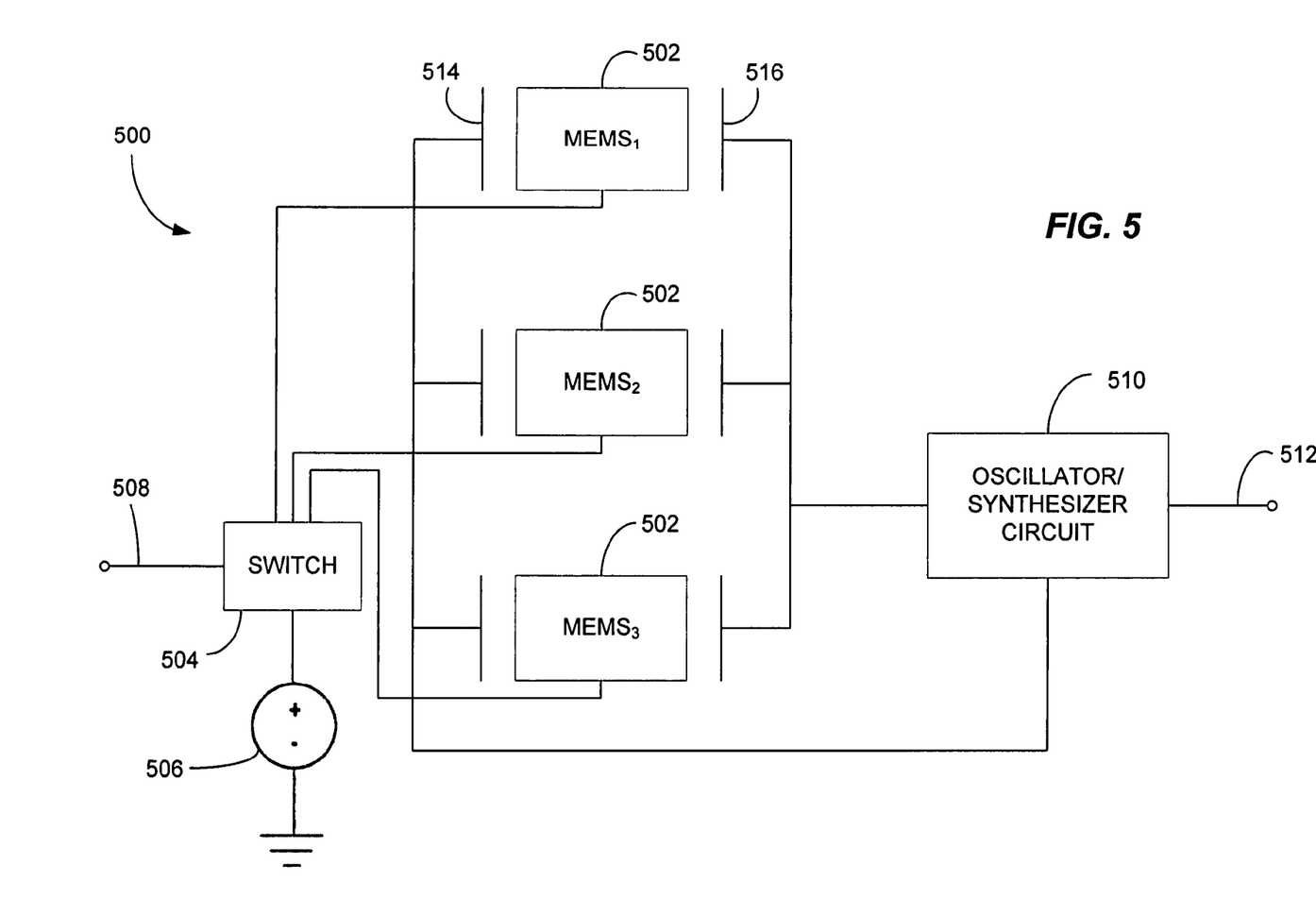

FIG. 5 depicts an alternative embodiment in which a signal generation device indicated generally at 500 includes a plurality of MEMS resonators 502. While the MEMS resonators 502 may (but need not) be of a similar design, each MEMS resonator 502 is configured to develop an output signal at a different resonant frequency for a given bias voltage. In this way, frequency modulation is implemented by selecting one of the MEMS resonators 502 based on a control signal that may be similar to the information-carrying control signals described above in connection with, for instance, the exemplary embodiment of FIG. 2. To this end, a switch 504 is provided to direct the DC voltage from a voltage source 506 to one of the MEMS resonators 502 in accordance with the data or information provided via a control signal at an input port 508. Specifically, the switch 504 is configured to be responsive to different levels (e.g., 0 and 3 V) of the control signal to switch between operational states.

In a fashion similar to that described above (and depicted in simplified form for ease in illustration), the operation of the MEMS resonators 502 may be facilitated by circuitry including oscillator/synthesizer circuitry 510, which may also be responsible for deriving an output signal of desired frequencies at an output port 512. To drive each of the MEMS resonators 502, the oscillator/synthesizer circuitry 510 may be connected to drive and sense electrodes 514 and 516 of each of the MEMS resonators 502 as shown.

Any number of MEMS resonators may be used, and any of the MEMS resonators suitable for use with the foregoing embodiments are also suitable for use with the embodiment of FIG. 5.

The multiple resonator embodiment of FIG. 5 may enable more flexible device designs, inasmuch as any frequency deviation may be supported, which may lead to larger or multiple deviations. As a result, the sensitivity requirements at the receiver end may be relaxed considerably.

Another potential advantage to the multiple resonator embodiment involves data throughput. In some cases, the switch 504 may be capable of switching speeds higher than the effective switching speed of a single MEMS resonator adjusting between operation at varying polarization voltages. Switching between the multiple resonators at higher speeds may then lead to higher data throughput.

In some cases, the data throughput may be further enhanced by combining the capabilities of the frequency modulation schemes supported by the disclosed devices and methods. For example, the embodiment shown in FIG. 5 may rely on a control signal that drives the switch to select different output frequencies for one level of frequency modulation. The control signal (or the voltage source) may also exhibit amplitude modulation for transmission of additional information.

One or more of the above-described embodiments can be implemented in connection with signal transmissions in the 433 MHz communication band. For example, a MEMS resonator may be configured to develop output frequencies centered around about 19.4 MHz. By adjusting the polarization voltage from about 2.5 V, the output frequency may vary from about 19.4200 MHz (Vp=2.1V) to about 19.4165 MHz (Vp=2.7V). Through the above-described and above-referenced frequency compensation and multiplication, those output frequencies may be translated to two distinct FSK outputs at (i) 433.92 MHz−40 kHz, and (ii) 433.92 MHz+40 kHz.

Other variations in the polarization voltage may be utilized. In one example, modulation of the polarization voltage between 0 and 1.2 V (about Vp=2.1V) resulted in progressively larger frequency deviations up to over 200 kHz. For instance, input voltage modulation of 0.6 V and 0.9 V resulted in about 80 kHz and 150 kHz of deviation, respectively. The input voltage supply was about 3 V. In this case, the output signal was tested at data transmission rates of 20 kbps over 10 m distances. As described above, practice of the disclosed devices and methods is not limited to such data transmission rates, and alternative embodiments such as the one shown in FIG. 5 may provide much high transmission rates.

Although well suited for carrying analog or digital information via the above-described modulation technique, the devices and methods described herein may also be utilized in clock and other non-data applications. In these cases, the input bit stream (provided as the bias voltage) may be encoded with a pseudorandom generated bit sequence to create a spread spectrum output signal at the FM output. If the output at the oscillator output is a clock signal used as a system clock, and the FM deviation is small, the clock output edge will be spread reducing EMI (electromagnetic Interference). This oscillator output can be used directly or can be used as the reference for a synthesizer or clock multiplier. Either way, the disclosed methods and devices can be used to lessen the amount of EMI that is otherwise typically generated in a clock oscillator circuit.

Embodiments of the disclosed system and method may be implemented in hardware, software, firmware or any combination thereof. Some embodiments may be implemented with computer programs executing on programmable systems having at least one processor, a data storage system (including volatile and non-volatile memory and/or storage elements), at least one input device, and at least one output device. The programs may be implemented in a high level procedural or object oriented programming language to communicate with a processing system. The programs may also be implemented in assembly or machine language, if desired. In fact, practice of the disclosed system and method is not limited to any particular programming language. In any case, the language may be a compiled or interpreted language.

While the present invention has been described with reference to specific examples, which are intended to be illustrative only and not to be limiting of the invention, it will be apparent to those of ordinary skill in the art that changes, additions and/or deletions may be made to the disclosed embodiments without departing from the spirit and scope of the invention.

The foregoing description is given for clearness of understanding only, and no unnecessary limitations should be understood therefrom, as modifications within the scope of the invention may be apparent to those having ordinary skill in the art.

What is claimed is:

1. A signal generator for communication of an information stream, the signal generator comprising:

a MEMS resonator comprising a resonant structure, a drive electrode and a sense electrode and configured for activation by a DC bias voltage applied to the resonant structure and development of a resonator signal at the sense electrode having a resonant frequency determined by the DC bias voltage in response to an excitation signal applied to the drive electrode, wherein the resonant structure is spaced from the drive electrode by a gap;

an oscillator circuit coupled to the MEMS resonator across the sense and drive electrodes to apply the excitation signal to the drive electrode to facilitate oscillation of the resonator signal and for generation of an output signal with a frequency based on the resonant frequency of the resonator signal; and, a port to receive a control signal representative of the information stream, the port being coupled to the MEMS resonator to modulate the DC bias voltage in accordance with the control signal such that the MEMS resonator is biased with the modulated DC bias voltage and both the resonant frequency and the frequency of the output signal are modulated to reflect the information stream.

2. The signal generator of claim 1, wherein the control signal comprises an amplitude-modulated signal reflective of the information stream to be transmitted via frequency modulation of the output signal, and wherein the port is coupled to the MEMS resonator such that the bias voltage reflects the amplitude-modulated signal.

3. The signal generator of claim 1, wherein the control signal comprises a digital data stream reflective of the information stream to be transmitted via frequency shift keying modulation of the output signal, and wherein the port is coupled to the MEMS resonator such that the bias voltage reflects the digital data stream.

4. The signal generator of claim 1, wherein the control signal comprises a pseudorandom generated bit sequence, and wherein the port is coupled to the MEMS resonator such that the bias voltage reflects the pseudorandom generated bit sequence.

5. A signal generator comprising:
a MEMS resonator configured for activation by a bias voltage and development of a resonator signal having a resonant frequency determined by the bias voltage;
an oscillator circuit coupled to the MEMS resonator to facilitate oscillation of the resonator signal and generation of an output signal based on the resonator signal;
a port coupled to the MEMS resonator to receive a control signal from which the bias voltage is determined such that the output signal is modulated by the control signal;
a plurality of MEMS resonators comprising the first-named MEMS resonator; and
a switch coupling the plurality of MEMS resonators and the port to selectively provide the bias voltage in accordance with the control signal.

6. The signal generator of claim 1, further comprising:
a temperature sensor to provide an indication of an operating temperature for the MEMS resonator; and,
a fractional-N synthesizer responsive to the operating temperature indication for frequency adjustment of the output signal from the oscillator circuit.

7. The signal generator of claim 1, further comprising a voltage source coupled to the port to generate the control signal in response to the information stream sensed by the voltage source.

8. A method of generation of a communication signal with a MEMS resonator having a resonant frequency determined by a DC bias voltage for transmission of an information stream provided by a control signal, the method comprising the steps of:
receiving the control signal;
modulating the DC bias voltage in accordance with the control signal;
biasing the MEMS resonator with the modulated DC bias voltage by applying the modulated DC bias voltage to a resonant structure of the MEMS resonator; and,
driving the MEMS resonator with an excitation signal from an oscillator across sense and drive electrodes of the MEMS resonator during the biasing step to generate the communication signal such that both the resonant frequency and a frequency of the communication signal reflect the information stream provided by the control signal;
wherein the resonant structure is spaced from the drive electrode by a gap.

9. The method of claim 8, wherein the control signal comprises an amplitude-modulated signal reflective of the information stream, and wherein the port is coupled to the MEMS resonator such that the bias voltage reflects the amplitude-modulated signal and the communication signal carries the information stream via frequency modulation.

10. The method of claim 8, wherein the control signal comprises a digital data stream reflective of the information stream, and wherein the port is coupled to the MEMS resonator such that the bias voltage reflects the digital data stream and the communication signal carries the information stream via frequency shift keying modulation.

11. The method of claim 8, wherein the control signal comprises a pseudorandom generated bit sequence, and wherein the port is coupled to the MEMS resonator such that the bias voltage reflects the pseudorandom generated bit sequence.

12. A method of generation of a communication signal for transmission of information carried by a control signal, the method comprising the steps of:
receiving the control signal;
activating a MEMS resonator via a bias voltage;
determining the bias voltage in accordance with the control signal; and
driving the MEMS resonator for the generation of the communication signal and the transmission of the information carried by the control signal;
wherein the determining step comprises providing the control signal to a switch to direct the control signal to a plurality of MEMS resonators for selected activation thereof in accordance with the information.

13. The method of claim 8, further comprising the step of generating the control signal with a voltage source responsive to the information stream.

14. A device to generate a communication signal for transmission of an information stream, comprising:
a data input to provide an input voltage indicative of the information stream;
a MEMS resonator comprising a drive electrode, a resonant structure spaced from the drive electrode by a gap, and a sense electrode at which an output signal with a frequency is developed based on a bias voltage applied to the resonant structure and determinative of a resonant frequency of the MEMS resonator wherein the resonant structure is coupled to the data input such that the bias voltage is modulated in accordance with the input voltage and the resonant structure is biased with the modulated bias voltage such that the resonant frequency of the MEMS resonator and the output signal frequency reflect the information stream;
an oscillator circuit coupled to the MEMS resonator across the sense and drive electrodes to apply a drive signal to the drive electrode to excite the resonant structure into resonance and to develop an oscillator signal based on the output signal frequency of the MEMS resonator; and,
a frequency synthesizer coupled to the oscillator circuit to generate the communication signal in accordance with the oscillator signal and the output signal frequency of the MEMS resonator such that a frequency of the communication signal reflects the information stream.

15. The signal generator of claim 14, wherein the input voltage comprises an amplitude-modulated signal reflective of the information stream, and wherein the port is coupled to the MEMS resonator such that the bias voltage reflects the amplitude-modulated signal.

16. The signal generator of claim 14, wherein the input voltage comprises a digital data stream reflective of the information stream, and wherein the port is coupled to the MEMS resonator such that the bias voltage reflects the digital data stream.

17. The signal generator of claim 1, further comprising:
a plurality of MEMS resonators coupled to the oscillator circuit, the plurality comprising the first-named MEMS resonator and having different resonant frequencies for a given bias voltage level; and
a switch coupled to the port and responsive to the control signal to switch the bias voltage among the plurality of MEMS resonators such that the frequency of the output signal reflects the information stream.

18. The signal generator of claim 17, further comprising a voltage source coupled to the switch and configured to provide the bias voltage such that the bias voltage comprises an amplitude-modulated signal reflective of further information to be transmitted via further frequency modulation of the output signal.

19. The method of claim 8, wherein the biasing step comprises the step of providing the control signal to a switch responsive to the control signal to switch the bias voltage among a plurality of MEMS resonators including the first-named MEMS resonator and having different resonant frequencies for a given bias voltage level such that the frequency of the communication signal reflects the information stream.

20. The method of claim 19, further comprising amplitude-modulating the bias voltage to reflect further information to be transmitted via further frequency modulation of the communication signal.

21. The device of claim 14, wherein the bias voltage is a DC bias voltage.

* * * * *